(12) United States Patent
Yoshimuta et al.

(10) Patent No.: US 9,985,150 B2
(45) Date of Patent: May 29, 2018

(54) RADIATION DETECTOR AND METHOD OF MANUFACTURING THE SAME

(75) Inventors: Toshinori Yoshimuta, Takatsuki (JP); Satoshi Tokuda, Kusatsu (JP); Koichi Tanabe, Uji (JP); Hiroyuki Kishihara, Kizugawa (JP); Masatomo Kaino, Kyoto-fu (JP); Akina Yoshimatsu, Osaka (JP); Toshiyuki Sato, Kyoto (JP); Shoji Kuwabara, Ibaraki (JP)

(73) Assignee: SHIMADZU CORPORATION, Kyoto (JP)

( * ) Notice: Subject to any disclaimer, the term of this patent is extended or adjusted under 35 U.S.C. 154(b) by 1235 days.

(21) Appl. No.: 13/639,318

(22) PCT Filed: Feb. 21, 2011

(86) PCT No.: PCT/JP2011/000953
§ 371 (c)(1),
(2), (4) Date: Oct. 4, 2012

(87) PCT Pub. No.: WO2011/125277
PCT Pub. Date: Oct. 13, 2011

(65) Prior Publication Data
US 2013/0026468 A1      Jan. 31, 2013

(30) Foreign Application Priority Data
Apr. 7, 2010   (JP) ................................ 2010-088754

(51) Int. Cl.
*H01L 31/0236*   (2006.01)
*H01L 27/146*   (2006.01)

(52) U.S. Cl.
CPC .... *H01L 31/0236* (2013.01); *H01L 27/14636* (2013.01); *Y02E 10/50* (2013.01)

(58) Field of Classification Search
CPC ......... H01L 31/02366; H01L 27/14676; H01L 27/14658; H01L 27/14659;
(Continued)

(56) References Cited

U.S. PATENT DOCUMENTS 5,273,911 A * 12/1993 Sasaki et al. .................. 438/62
6,344,370 B1   2/2002 Izumi et al.
(Continued)

FOREIGN PATENT DOCUMENTS

EP      2244294 A1   10/2010
JP    2000-307091 A   11/2000
(Continued)

OTHER PUBLICATIONS

International Search Report issued in International Patent Application No. PCT/JP2011/000953 dated May 24, 2011.
(Continued)

*Primary Examiner* — Steven Loke
*Assistant Examiner* — Scott Stowe
(74) *Attorney, Agent, or Firm* — McDermott Will & Emery LLP

(57) ABSTRACT

A graphite substrate is processed to have surface unevenness in a range of 1 μm to 8 μm. Thereby, a semiconductor film to be laminated on the graphite substrate has a stable film quality, and thus adhesion of the graphite substrate and the semiconductor layer can be enhanced. When an electron blocking layer is interposed between the graphite substrate and the semiconductor layer, the electron blocking layer is thin and thus the surface unevenness of the graphite substrate is transferred onto the electron blocking layer. Consequently, the electron blocking layer also has surface unevenness approximately in such range. Thus, almost the
(Continued)

same effect as a configuration in which the semiconductor layer is directly connected to the graphite substrate can be produced.

10 Claims, 5 Drawing Sheets

(58) Field of Classification Search
CPC ......... H01L 27/14661; H01L 27/14663; H01L 27/308; H01L 31/085; H01L 31/115
See application file for complete search history.

(56) References Cited

U.S. PATENT DOCUMENTS

2002/0192471 A1* 12/2002 Homme et al. ............... 428/408
2010/0029037 A1    2/2010 Tokuda et al.

FOREIGN PATENT DOCUMENTS

| JP | 2000-352586 | A | 12/2000 |
|----|----|----|----|
| JP | 2001-242256 | A | 9/2001 |
| JP | 2002-026300 | A | 1/2002 |
| JP | 2007-235039 | A | 9/2007 |
| JP | 2008-071961 | A | 3/2008 |
| WO | 2009101670 | A1 | 8/2009 |

OTHER PUBLICATIONS

Supplementary Partial European Search Report EP 11 76 5179 dated Oct. 14, 2014.

* cited by examiner (a)

(b)

(c)

RADIATION DETECTOR AND METHOD OF MANUFACTURING THE SAME

CROSS REFERENCE TO RELATED APPLICATIONS

This application is a U.S. National Stage application under 35 U.S.C. § 371, of International Application PCT/JP2011/000953 filed on Feb. 21, 2011, which was published as WO 2011/125277 on Oct. 13, 2011. The application is incorporated herein by reference.

TECHNICAL FIELD

This invention relates to a radiation detector and a method of manufacturing thereof for use in the medical, industrial, nuclear and other fields.

BACKGROUND

Conventionally, research and development of various semiconducting materials, particularly a crystal of CdTe (Cadmium Telluride), ZnTe (Zinc Telluride), or CdZnTe (Cadmium Zinc Telluride), has been conducted as a material for a high-sensitive radiation detector. A part of the materials has been commercially available. A semiconductor layer formed by CdTe, ZnTe, or CdZnTe is a polycrystalline film. See, for example, Japanese Patent Publication No. JP-A-2001-242256.

With the configuration as above, however, a portion with a large amount of leakage current, a so-called "leak spot" may occur partially. Moreover, a semiconductor layer to be laminated may have poor adhesion. Furthermore, a porous film may be formed. Such drawbacks may arise.

This invention has been made regarding the state of the art noted above, and its one object is to provide a radiation detector and a method of manufacturing thereof in which a semiconductor film to be laminated on a substrate has a stable film quality, and thus adhesion of the substrate and the semiconductor layer can be enhanced.

SUMMARY

To fulfill the above object, Inventors have made intensive research and attained the following findings.

Conventionally, a condition of a front face of a substrate with a semiconductor layer laminated thereon is not specified. Thus problems due to a condition of the front face of the substrate are unclear. Then, giving attention to the substrate, it has been proved through experiments that unevenness on the front face of the substrate adversely affects the semiconductor layer. Specifically, FIGS. 5(*a*) through 5(*c*) indicate experimental data when a graphite substrate is adopted as the substrate. From the experimental data, it has been found that larger unevenness adversely affects crystal growth of the semiconductor layer to be laminated, leading to leak spots, whereas smaller unevenness causes poor adhesion of the semiconductor layer to be laminated, leading to formation of a porous film.

FIG. 5(*a*) is an image observed by 100 times in which a semiconductor layer is laminated (film formation) on a substrate having surface unevenness (surface roughness) in a range of 1 μm to 8 μm. FIG. 5(*b*) is an image observed by 100 times in which a semiconductor layer is laminated on a substrate having surface unevenness of less than 1 μm. FIG. 5(*c*) is an image observed by 500 times in which a semiconductor layer is laminated on a substrate having surface unevenness of more than 8 μm. In FIGS. 5(*a*) through 5(*c*), it is assumed that film formation conditions other than the substrate are all the same and only differences on the surface are seen from an upper side of the image. As is apparent from FIG. 5(*b*), the semiconductor layer laminated on the substrate having unevenness of less than 1 μm is rough and porous comparing to that in FIG. 5(*a*). As is apparent from FIG. 5(*c*), the semiconductor layer laminated on the substrate having unevenness of more than 8 μm contains a film boundary from the upper left to the lower right of the image. Such boundaries scatter in the substrate having unevenness of more than 8 μm, which becomes leak spots where leakage current flows excessively.

Consequently, from the foregoing experimental data in FIGS. 5(*a*) through 5(*c*), the finding has been obtained that the substrate having surface unevenness in a range of 1 μm to 8 μm as in FIG. 5(*a*) can overcome the foregoing drawbacks.

This invention based on the above finding adopts the following configuration. One example of this invention discloses a radiation detector for detecting radiation. The radiation detector includes a polycrystalline-film semiconductor layer formed by CdTe (Cadmium Telluride), ZnTe (Zinc Telluride), or CdZnTe (Cadmium Telluride Zinc) for converting radiation information into charge information by incidence of radiation; a graphite substrate for voltage application electrode doubling as a support substrate for applying bias voltage to the semiconductor layer; and a read-out substrate with pixel electrodes formed for every pixel for reading out the charge information. When the semiconductor layer is laminated on the graphite substrate and the graphite substrate with the semiconductor layer laminated thereon is joined to the read-out substrate such that the semiconductor layer and the pixel electrodes are joined inside, the graphite substrate has surface unevenness in a range of 1 μm to 8 μm.

Operation and Effect

According to the radiation detector in this example of the invention, the polycrystalline-film semiconductor layer is formed by CdTe, ZnTe, or CdZnTe. The graphite substrate doubling as the voltage application electrode and the support substrate is adopted as the substrate. The read-out substrate has the pixel electrodes. In this case, the graphite substrate has surface unevenness in a range of 1 μm to 8 μm. Such range can prevent poor adhesion of the substrate and the semiconductor layer due to the rough and porous film quality of the semiconductor layer when the substrate has unevenness of less than 1 μm. Moreover, such range can prevent occurrence of the leak spots when the substrate has unevenness of more than 8 μm. Consequently, a semiconductor film to be laminated on the substrate has a stable film quality, and thus adhesion of the substrate and the semiconductor layer can be enhanced.

Another example of this invention discloses a radiation detector for detecting radiation. The radiation detector includes a polycrystalline-film semiconductor layer formed by CdTe (Cadmium Telluride), ZnTe (Zinc Telluride), or CdZnTe (Cadmium Telluride Zinc) for converting radiation information into charge information by incidence of radiation; a graphite substrate for voltage application electrode doubling as a support substrate for applying bias voltage to the semiconductor layer; pixel electrodes formed for every pixel for reading out the charge information; and a read-out substrate having a read-out pattern formed thereon. When the semiconductor layer is laminated on the graphite substrate, the pixel electrodes are laminated on the semiconductor layer, and the graphite substrate with the semiconductor layer laminated thereon is joined to the read-out substrate together with the pixel electrodes such that the pixel electrodes are joined to a read-out substrate side, the graphite substrate has surface unevenness in a range of 1 μm to 8 μm.

Operation and Effect

According to the radiation detector in this example of the invention, the polycrystalline-film semiconductor layer is formed by CdTe, ZnTe, or CdZnTe. The graphite substrate doubling as the voltage application electrode and the support substrate is adopted as the substrate. The pixel electrodes are provided on a graphite substrate side. In this case, the graphite substrate has surface unevenness in a range of 1 μm to 8 μm. Such range can prevent poor adhesion of the substrate and the semiconductor layer due to the rough and porous film quality of the semiconductor layer when the substrate has unevenness of less than 1 μm. Moreover, such range can prevent occurrence of the leak spots when the substrate has unevenness of more than 8 μm. Consequently, a semiconductor film to be laminated on the substrate has a stable film quality, and thus adhesion of the substrate and the semiconductor layer can be enhanced.

Another example of this invention discloses a radiation detector for detecting radiation. The radiation detector includes a polycrystalline-film semiconductor layer formed by CdTe (Cadmium Telluride), ZnTe (Zinc Telluride), or CdZnTe (Cadmium Telluride Zinc) for converting radiation information into charge information by incidence of radiation; a voltage application electrode for applying bias voltage to the semiconductor layer; pixel electrodes formed for every pixel for reading out the charge information; a support substrate composed of any of aluminum oxide, aluminum nitride, boron nitride, oxidization silicon, silicon nitride and silicon carbide, or obtained through firing mixture of these materials for supporting the voltage application electrode, the semiconductor layer, and the pixel electrodes; and a read-out substrate having a read-out pattern formed thereon. The support substrate has surface unevenness in a range of 1 μm to 8 μm when the voltage application electrode is laminated on the support substrate, the semiconductor layer is laminated on the voltage application electrode, the pixel electrodes are laminated on the semiconductor layer, and the support substrate the voltage application electrode laminated thereon is joined to the read-out substrate together with the pixel electrodes and the semiconductor layer such that the pixel electrodes are joined to a read-out substrate side.

Operation and Effect

According to the radiation detector in this example of the invention, the polycrystalline-film semiconductor layer is formed by CdTe, ZnTe, or CdZnTe. The support substrate performing support independently of the voltage application electrode is adopted as the substrate. The pixel electrodes are provided on the support substrate side. In this case, the support substrate has surface unevenness in a range of 1 μm to 8 μm. Such range can prevent poor adhesion of the substrate and the semiconductor layer due to the rough and porous film quality of the semiconductor layer when the substrate has unevenness of less than 1 μm. Moreover, such range can prevent occurrence of the leak spots when the substrate has unevenness of more than 8 μm. Consequently, a semiconductor film to be laminated on the substrate has a stable film quality, and thus adhesion of the substrate and the semiconductor layer can be enhanced. Here, when the support substrate is adopted, the support substrate may be composed of any of aluminum oxide, aluminum nitride, boron nitride, oxidization silicon, silicon nitride and silicon carbide, or may be obtained through firing mixture of these materials. The voltage application electrode between the support substrate and the semiconductor layer is thin and unevenness on the surface of the support substrate is transferred to the voltage application electrode. Consequently, when the support substrate has surface unevenness in a range of 1 μm to 8 μm, the voltage application electrode also have surface unevenness approximately in such range. Thus, almost the same effect as the configuration in which the semiconductor layer is laminated on the support substrate can be produced.

In the radiation detector in the foregoing examples of the invention, at least either an electron blocking layer or a positive-hole blocking layer preferably contacts the semiconductor layer directly. Particularly, an electron blocking layer or a positive-hole blocking layer is interposed between the graphite substrate or the support substrate and the semiconductor layer, the blocking layer is thins and unevenness on the surface of the graphite substrate or the support substrate is transferred to the blocking layer. Consequently, when the graphite substrate or the support substrate has surface unevenness in a range of 1 μm to 8 μm, the blocking layer also has surface unevenness approximately in such range. Thus, almost the same effect as the configuration in which the semiconductor layer is laminated on the graphite substrate or the support substrate can be produced.

In a method of manufacturing the radiation detector in the foregoing examples of the invention, it is possible to process unevenness of the substrate surface to be in a range of 1 μm to 8 μm through a surface treatment using any of milling, polishing, a blast processing or an etching processing. Moreover, cleaning treatment for cleaning the substrate is preferably performed prior to the foregoing surface treatment. Impurities and particles, etc. on the substrate surface are removed through cleaning, whereby unevenness of the substrate surface is readily processed to be in a range of 1 μm to 8 μm.

According to the radiation detector and the method of manufacturing the radiation detector in the examples of the invention, the substrate (the graphite substrate or the support substrate) has surface unevenness in a range of 1 μm to 8 μm. Thereby, a semiconductor film to be laminated on the substrate has a stable film quality, and thus adhesion of the substrate and the semiconductor layer can be enhanced.

BRIEF DESCRIPTION OF THE DRAWINGS

FIG. 5(a) is an image observed by 100 times in which a semiconductor layer is laminated on a substrate having surface unevenness in a range of 1 μm to 8 μm. FIG. 5(b) is an image observed by 100 times in which a semiconductor layer is laminated on a substrate having surface unevenness of less than 1 μm. FIG. 5(c) is an image observed by 500 times in which a semiconductor layer is laminated on a substrate having surface unevenness of more than 8 μm.

DESCRIPTION OF REFERENCES

Figure 1:
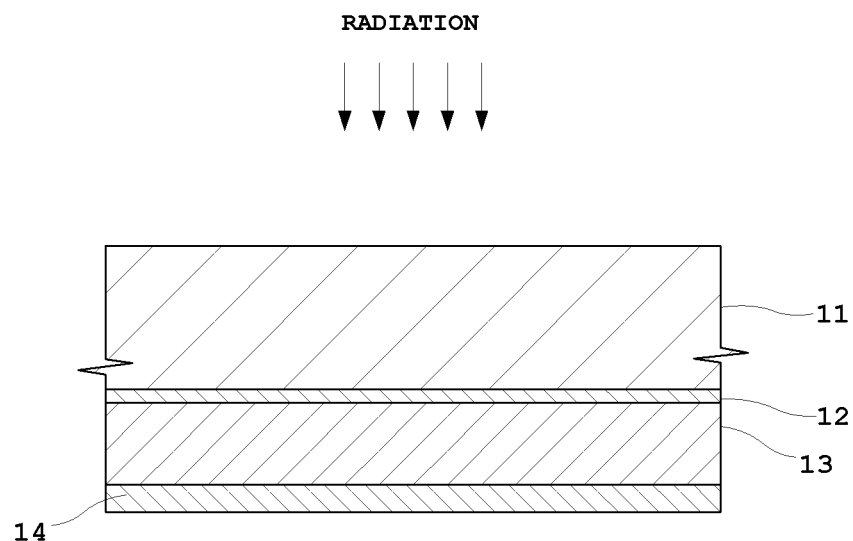
FIG. 1 is a longitudinal sectional view showing a configuration of a radiation detector on a graphite substrate side according to one example.

11 . . . graphite substrate
11a . . . support substrate
11b . . . voltage application electrode
12 . . . electron blocking layer
13 . . . semiconductor layer
14 . . . positive-hole blocking layer
15, 22 . . . pixel electrode
21 . . . read-out substrate

DETAILED DESCRIPTION

EXAMPLES

Example 1

Figure 2:
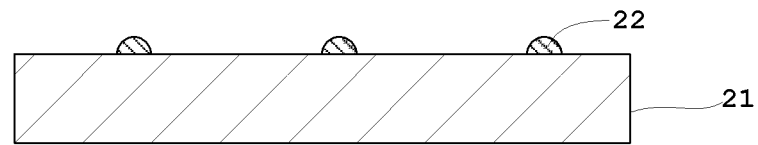
FIG. 2 is a longitudinal sectional view showing a configuration of the radiation detector on a read-out substrate side according to the example.
Figure 3:
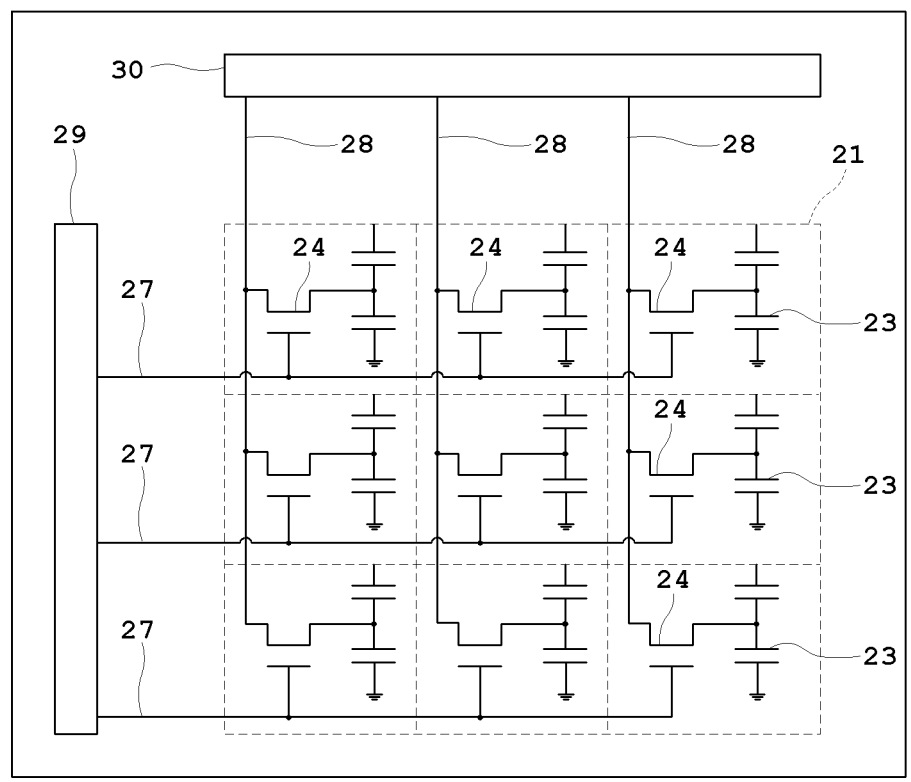
FIG. 3 is a circuit diagram showing a configuration of a read-out substrate and adjacent circuits.
Figure 4:
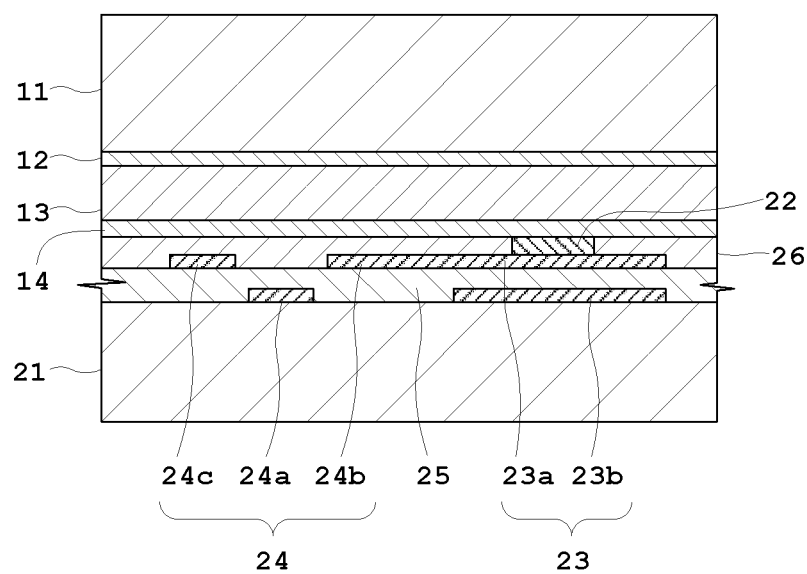
FIG. 4 is a longitudinal sectional view in which a configuration on the graphite substrate side is joined to a configuration on the read-out side according to the example of this invention.

Example 1 of the invention will be described in detail hereinafter with reference to the drawings. FIG. 1 is a longitudinal sectional view showing a configuration of a radiation detector on a graphite substrate side according to one example. FIG. 2 is a longitudinal sectional view showing a configuration of the radiation detector on a read-out substrate side according to the example. FIG. 3 is a circuit diagram showing a configuration of a read-out substrate and adjacent circuits. FIG. 4 is a longitudinal sectional view in which a configuration on the graphite substrate side is joined to a configuration on the read-out side according to the example of this invention.

As shown in FIGS. 1 through 4, a radiation detector is divided roughly into a graphite substrate 11 and a read-out substrate 21. As shown in FIGS. 1 and 4, an electron blocking layer 12, a semiconductor layer 13, and a positive-hole blocking layer 14 are laminated in this order on the graphite substrate 11. As shown in FIGS. 2 and 4, the read-out substrate 21 has pixel electrodes 22, to be mentioned later, for pattern formation of a capacitor 23, and a thin film transistor 24, etc. In FIG. 2, only shown are the read-out substrate 21 and the pixel electrodes 22. The graphite substrate 11 corresponds to the graphite substrate in this invention. The electron blocking layer 12 corresponds to the electron blocking layer in this invention. The semiconductor layer 13 corresponds to the semiconductor layer in this invention. The positive-hole blocking layer 14 corresponds to the positive-hole blocking layer in this invention. The read-out substrate 21 corresponds to the read-out substrate in this invention. The pixel electrode 22 corresponds to the pixel electrode in this invention.

As shown in FIG. 1, the graphite substrate 11 doubles as a support substrate 11a and a voltage application electrode 11b to be mentioned later in Example 3. Specifically, the graphite substrate 11 for voltage application electrode constructs the radiation detector in Example 1. The graphite substrate 11 doubling as the support substrate 11a applies bias voltage (in Examples 1 through 3, bias voltage in a range of −0.1V/μm to 1V/μm) to the semiconductor layer 13. The graphite substrate 11 is composed of a plate material of conductive carbon graphite. For the graphite substrate 11, a flat plate material (thickness of approximately 2 mm) having controlled firing conditions is used so as to conform to thermal expansion coefficient of the semiconductor layer 13.

The semiconductor layer 13 converts radiation information into charge information (carriers) by incidence of radiation (e.g., X-rays). For the semiconductor layer 13, a polycrystalline film formed by CdTe (Cadmium Telluride), ZnTe (Zinc Telluride), or CdZnTe (Cadmium Telluride Zinc) is used. Thermal expansion coefficient of the semiconductor layer 13 is approximately 5 ppm/deg. for CdTe, approximately 8 ppm/deg. for ZnTe. For CdZnTe, thermal expansion coefficient of the semiconductor layer 13 takes on a mean value of these values depending on a concentration of Zn.

For the electron blocking layer 12, a P-type semiconductor, such as ZnTe, $Sb_2S_3$, and $Sb_2Te_3$, is used. For the positive-hole blocking layer 14, an N-type semiconductor such as CdS, ZnS, ZnO, and $Sb_2S_3$, or an ultra-high resistance semiconductor is used. Here in FIGS. 1 and 4, the positive-hole blocking layer 14 is formed successively. Alternatively, the positive-hole blocking layer 14 may be divided corresponding to the pixel electrodes 22 where the positive-hole blocking layer 14 has low film resistance. When the positive-hole blocking layer 14 is divided corresponding to the pixel electrodes 22, the positive-hole blocking layer 14 has to be aligned with the pixel electrode 22 upon joining the graphite substrate 11 to the read-out substrate 21. Moreover, either the electron blocking layer 12 or the positive-hole blocking layer 14, or both of them may be omitted as long as the radiation detector has no problem in its property.

As shown in FIG. 2, bump bonding is performed on a portion (a pixel region) of a capacity electrode 23a of a capacitor 23 to be mentioned later (see FIG. 4) with a conductive material (a conductive paste, an anisotropic conductive film (ACF), anisotropic conductive paste, etc.) upon joining the read-out substrate 21 to the graphite substrate 11. Thereby the read-out substrate 21 forms the pixel electrode 22 on the portion. Thus the pixel electrode 22 is formed for every pixel, and reads out the carriers converted in the semiconductor layer 13. A glass substrate is used for the read-out substrate 21.

As shown in FIG. 3, the read-out substrate 21 has the capacitors 23 as a charge storage capacity and the thin-film transistors 24 as switching elements. They are divided for every pixel to form a pattern. FIG. 3 shows only 3×3 pixels. In actual, the read-out substrate 21 having a size corresponding to the pixel number of two-dimensional radiation detectors (e.g., 1024×1024 pixels) is used.

As shown in FIG. 4, the capacity electrodes 23a of the capacitor 23 and the gate electrodes 24a of the thin film transistor 24 are laminated on the surface of the read-out substrate 21 and are covered with an insulating layer 25. Then a reference electrode 23b of the capacitor 23 is laminated on the insulating layer 25 as to face to the capacity electrodes 23a across the insulating layer 25. A source electrode 24b and a drain electrode 24c of the thin film transistor 24 are laminated and covered with an insulating layer 26 except for connecting segments of the pixel electrode 22. Here, the capacity electrode 23a and the source electrode 24b are electrically connected one another. As shown in FIG. 4, the capacity electrode 23a and the source electrode 24b may be formed integrally and simultaneously. The reference electrode 23b is grounded. For instance, plasma SiN is used for the insulating layers 25 and 26.

As shown in FIG. 3, a gate line 27 is electrically connected to the gate electrode 24a of the thin-film transistor 24 in FIG. 4, and a gate line 28 is electrically connected to the drain electrode 24c of the thin-film transistor 24 in FIG. 4. Each gate line 27 extends in a row direction of each pixel. Each data line 28 extends in a column direction of each pixel. The gate line 27 and the data line 28 intersect to each other. The capacitors 23, the thin-film transistors 24, the insulating layers 25, 26 in addition to the gate lines 27 and the data lines 28 are formed on the surface of the read-out substrate composed of a glass substrate to have a pattern using a semiconductor film production technology and an ultra-fine processing technology.

Moreover, as shown in FIG. 3, a gate drive circuit 29 and a read-out circuit 30 are provided around the read-out substrate 21. The gate drive circuit 29 is electrically connected to each of the gate lines 27 extending in a row direction for driving pixels in each row in turn. The read-out circuit 30 is electrically connected to each of the data lines 28 extending in a column direction for reading out carriers of each pixel via the gate lines 28. The gate drive circuits 29 and the read-out circuits 30 are composed of semiconductor integrated circuits, such as silicon, and electrically connect the gate lines 27 and the data lines 28, respectively, via an anisotropic conductive film (ACF) etc.

Next, description will be given of a concrete method of manufacturing the aforementioned radiation detector.

A surface treatment is performed on the graphite substrate 11 such that the graphite substrate 11 has surface unevenness in a range of 1 µm to 8 µm. Preferably, a cleaning treatment for cleaning the graphite substrate 11 is performed prior to the surface treatment to remove impurities and particles on the surface of the graphite substrate 11. For the surface treatment, milling may be performed on the graphite substrate 11 that is cut while rotation. Alternatively, a polishing processing may be performed on the graphite substrate 11. Another approach may be adopted. For instance, the graphite substrate 11 is planarized and then a blast processing is performed on the planarized graphite substrate 11 through collision of a powder such as carbon dioxide ($CO_2$), glass beans, and alumina ($Al_2O_3$). In addition, an etching processing may be applied to the graphite substrate 11. As above, the surface treatment is performed on the graphite substrate 11 using any of milling, polishing, a blast processing and an etching processing, whereby the graphite substrate 11 can be processed to have surface unevenness in a range of 1 µm to 8 µm.

Next, the electron blocking layer 12 is laminated on the graphite substrate 11 having the specified unevenness in a range of 1 µm to 8 µm through sublimation, evaporation, spattering process, chemical deposition, or electro-crystallization.

The semiconductor layer 13 as a conversion layer is laminated on the electron blocking layer 12 through sublimation. In Example 1, an X-ray detector with energy of several tens keV to several hundreds keV is used. Thus a ZnTe or CdZnTe film containing several mol % to several tens mol % of zinc (Zn) having a thickness of approximately 300 µm is formed as the semiconductor layer 13 through closed spaced sublimation. Of course, a CdTe film containing no Zn may be formed as the semiconductor layer 13. Here, sublimation is not limitative for formation of the semiconductor layer 13. Metal Organic Chemical Vapor Deposition (MOCVD) may be adopted. Moreover, a paste containing CdTe, ZnTe, or CdZnTe may be applied to form a polycrystalline film semiconductor layer 13 composed of CdTe, ZnTe, or CdZnTe. The semiconductor layer 13 is planarized through polishing or sand blast processing in which a blast processing is performed by spraying abrasive such as sand.

Next, the positive-hole blocking layer 14 is laminated on the planarized semiconductor layer 13 through sublimation, evaporation, spattering, chemical deposition, or electro-crystallization.

Next, as shown in FIG. 4, the graphite substrate 11 having the semiconductor layer 13 laminated thereon is joined to the read-out substrate 21 such that the semiconductor layer 13 is joined to the pixel electrodes 22 inside. As noted above, bump bonding is performed on a portion of the capacity electrode 23a that is not covered with the insulating layer 26 with a conductive material (a conductive paste, an anisotropic conductive film (ACF), anisotropic conductive paste, etc.). Thereby the electrodes 22 are formed on the portion, where the graphite substrate 11 is joined to the read-out substrate 21.

According to the radiation detector in Example 1 having the aforementioned configuration, the polycrystalline-film semiconductor layer 13 is formed by CdTe, ZnTe, or CdZnTe. The graphite substrate 11 doubling as the voltage application electrode and the support substrate is adopted as the substrate. The pixel electrodes 22 are provided on the read-out substrate 21 side. In this case, the graphite substrate 11 has surface unevenness in a range of 1 µm to 8 µm. Such range can prevent poor adhesion of the graphite substrate 11 and the semiconductor layer 13 due to the rough and porous film quality of the semiconductor layer 13 when the graphite substrate 11 has unevenness of less than 1 µm. Moreover, such range can prevent occurrence of the leak spots when the graphite substrate 11 has unevenness of more than 8 µm. Consequently, the semiconductor layer 13 to be laminated on the graphite substrate 11 has a stable film quality, and thus adhesion of the graphite substrate 11 and the semiconductor layer 13 can be enhanced.

Figure 5:
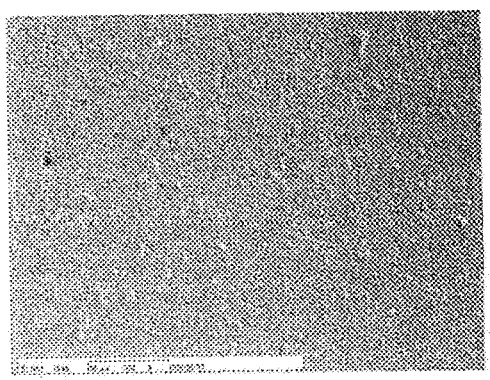
FIG. 5 is experimental data adopting a graphite substrate as a substrate.
Figure 5:
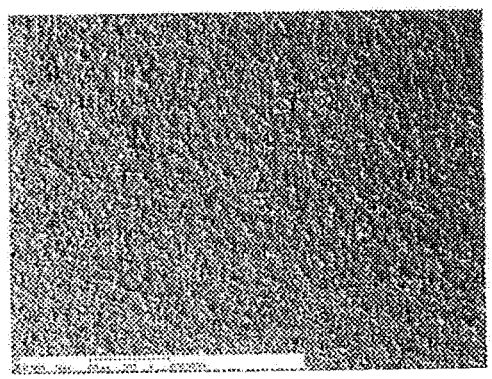
Figure 5:
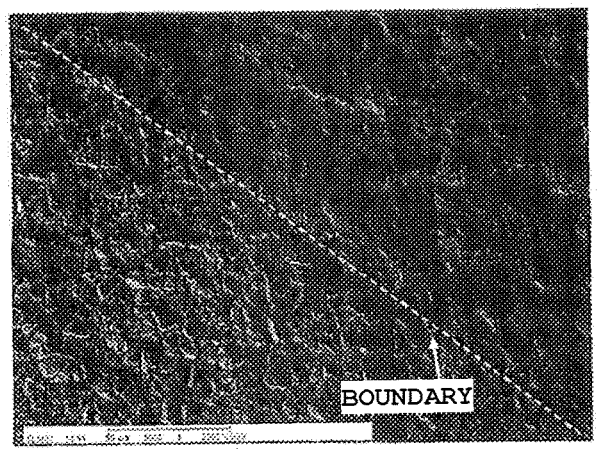

Moreover, when the graphite substrate 11 has surface unevenness in a range of 1 µm to 8 µm, it has been confirmed from experimental data shown in FIG. 5(a) that the semiconductor layer 13 to be laminated on the graphite substrate 11 has a stable film quality, and thus adhesion of the graphite substrate 11 and the semiconductor layer 13 can be enhanced, which has already been mentioned in the above findings.

Figure 6:
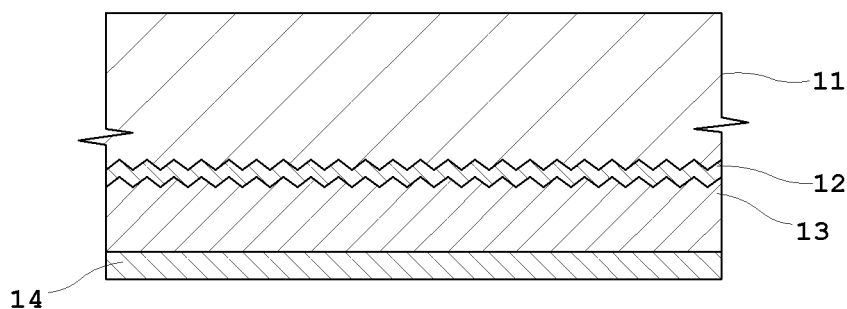
FIG. 6 is a schematic view used for explanation of transferring unevenness when an electron blocking layer is interposed between the graphite substrate and the semiconductor layer.

In Example 1, the electron blocking layer 12 is directly connected to the semiconductor layer 13 on the graphite substrate 11 side, whereas the positive-hole blocking layer 14 is directly connected to the semiconductor layer 13 on a side opposite to the graphite substrate 11 side. Consequently, the electron blocking layer 12 is interposed between the graphite substrate 11 and the semiconductor layer 13. When the electron blocking layer 12 is interposed between the graphite substrate 11 and the semiconductor layer 13 as in Example 1, the blocking layers 12 and 14 are thin, and thus the surface unevenness of the graphite substrate 11 is transferred onto the blocking layer (the electron blocking layer 12 in Example 1) as shown in the schematic view of FIG. 6. Consequently, when the graphite substrate 11 has surface unevenness in a range of 1 μm to 8 μm, the blocking layer (the electron blocking layer 12) also has surface unevenness approximately in such range. Thus, almost the same effect as the configuration in which the semiconductor layer 13 is directly connected to the graphite substrate 11 can be produced. In the schematic view of FIG. 6, the unevenness is enlarged comparing to the surroundings for illustrating the unevenness clearly. Please note that a practical size of the unevenness is smaller.

Moreover, when positive bias voltage is applied, the positive-hole blocking layer 14 is interposed between the graphite substrate 11 and the semiconductor layer 13. Also in this configuration, surface unevenness of the graphite substrate 11 is transferred onto the positive-hole blocking layer 14. Consequently, when the graphite substrate 11 has surface unevenness in a range of 1 μm to 8 μm, the positive-hole blocking layer 14 also has surface unevenness approximately in such range. Thus, almost the same effect as the configuration in which the semiconductor layer 13 is directly connected to the graphite substrate 11 can be produced.

In Example 1, the surface treatment is performed on the graphite substrate 11 using any of milling, polishing, a blast processing and an etching processing, whereby the graphite substrate 11 can be processed to have surface unevenness in a range of 1 μm to 8 μm. Moreover, a cleaning treatment for cleaning the graphite substrate 11 is preferably performed prior to the aforementioned surface treatment. Impurities and particles on the surface of the substrate can be removed through the cleaning treatment. Thereby the surface of the graphite substrate 11 can readily be processed to have surface unevenness in a range of 1 μm to 8 μm.

Example 2

Figure 7:
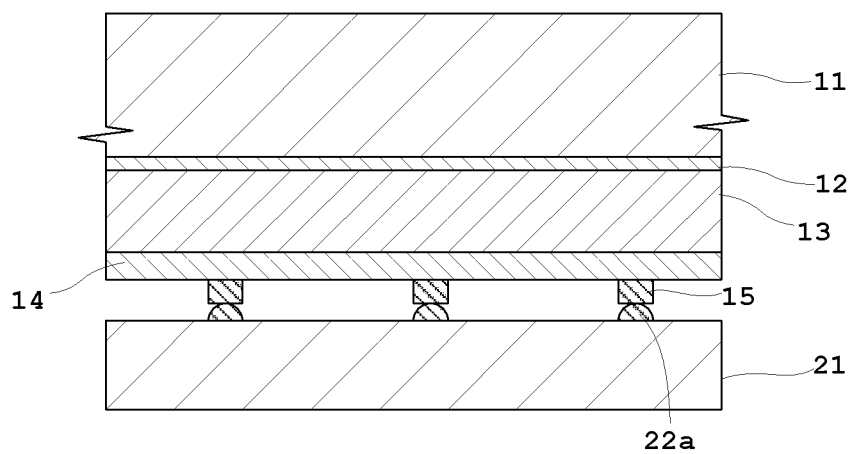
FIG. 7 is a longitudinal sectional view in which a configuration on a graphite substrate side is joined to a configuration on a read-out side according to another example of this invention.

Next, Example 2 of this invention will be described in detail hereinafter with reference to the drawings. FIG. 7 is a longitudinal sectional view in which a configuration on the graphite substrate side is joined to a configuration on the read-out side according to Example 2. In FIG. 7, a read-out pattern of such as a capacitor 23 and a thin film transistor 24 on the read-out substrate 21 side is omitted. Only a read-out substrate 21 and bumps 22a are illustrated.

Example 2 differs from Example 1 in that the pixel electrodes 15 are provided not the read-out substrate 21 side in Example 1 but on the graphite substrate 11 side shown in FIG. 7. That is, in Example 2, the electron blocking layer 12, the semiconductor layer 13, and the positive-hole blocking layer 14 are laminated in this order on the graphite substrate 11 as in Example 1, and the pixel electrodes 15 are further laminated on the positive-hole blocking layer 14. Where the positive-hole blocking layer 14 is not provided, the pixel electrodes 15 are directly connected to the semiconductor layer 13.

Example 2 differs from Example 1 in that not a bump as in Example 1 but a conductive material such as ITO, Au, and Pt, is used for the pixel electrode 15. The material used for the other graphite substrate 11, the electron blocking layer 12, the semiconductor layer 13, and the positive-hole blocking layer 14 is the same as that in Example 1 mentioned above. Similar to aforementioned Example 1, either the electron blocking layer 12 or the positive-hole blocking layer 14, or both of them may be omitted as long as the radiation detector has no problem in its property. The pixel electrode 15 corresponds to the pixel electrode in this invention.

Similar to Example 1, the read-out substrate 21 has the capacitor 23 and the thin film transistor 24, etc. (see FIG. 4) to form a pattern. In Example 2, the bumps 22a are formed on a portion (a pixel region) corresponding to the capacity electrodes 23a of the capacitor 23 (see FIG. 4), and are connected to the pixel electrodes 15. Thereby the graphite substrate 11 is joined to the read-out substrate 21. As noted above, in Example 2, the bumps 22a have to be aligned with the pixel electrodes 15 upon joining the graphite substrate 11 to the read-out substrate 21. The pixel electrodes 15 may function as a barrier layer depending on the material forming the pixel electrodes 15.

Next, description will be given of a concrete method of manufacturing the aforementioned radiation detector.

Similar to Example 1, a surface treatment is performed on the graphite substrate 11 using any of milling, polishing, a blast processing and an etching processing, whereby the graphite substrate 11 can be processed to have surface unevenness in a range of 1 μm to 8 μm. A cleaning treatment for cleaning the graphite substrate 11 is preferably performed prior to the aforementioned surface treatment. Thereby impurities and particles on the surface of the graphite substrate 11 can be removed.

Next, the electron blocking layer 12, the semiconductor layer 13, and the positive-hole blocking layer 14 are laminated in this order on the graphite substrate 11 having the specified unevenness in a range of 1 μm to 8 μm. The electron blocking layer 12, the semiconductor layer 13, and the positive-hole blocking layer 14 are formed in the same manner as in Example 1.

Then the graphite substrate 11 on which the semiconductor layer 13 is laminated is joined to the read-out substrate 21 together with the pixel electrodes 15 such that the pixel electrodes 15 are joined to the read-out substrate 21 side. As noted above, the bump 22a are formed on a portion of the capacity electrode 23a (see FIG. 4) that is not covered with the insulating layer 26 (see FIG. 4), and are connected to the pixel electrodes 15. Thereby the graphite substrate 11 is joined to the read-out substrate 21.

According to the radiation detector in Example 2 having the aforementioned configuration, the polycrystalline-film semiconductor layer 13 is formed by CdTe, ZnTe, or CdZnTe. The graphite substrate 11 doubling as the voltage application electrode and the support substrate is adopted as the substrate in Example 2. The pixel electrodes 15 are provided on the graphite substrate 11 side. In this case, the graphite substrate 11 has surface unevenness in a range of 1 μm to 8 μm. Similar to Example 1, when the graphite substrate 11 has surface unevenness of 1 μm to 8 μm, the semiconductor layer 13 to be laminated on the graphite substrate 11 has a stable film quality, and thus adhesion of the graphite substrate 11 and the semiconductor layer 13 can be enhanced.

In Example 2, similar to Example 1, the electron blocking layer 12 is directly connected to the semiconductor layer 13 on the graphite substrate 11 side, whereas the positive-hole blocking layer 14 is directly connected to the semiconductor layer 13 on a side opposite to the graphite substrate 11 side. Thereby the electron blocking layer 12 is interposed between the graphite substrate 11 and the semiconductor layer 13. When the electron blocking layer 12 is interposed between the graphite substrate 11 and the semiconductor layer 13, the surface unevenness of the graphite substrate 11 is transferred onto the blocking layer (the electron blocking layer 12 in Example 2). Consequently, almost the same effect as the configuration in which the semiconductor layer 13 is directly connected to the graphite substrate 11 can be produced.

In Example 2, similar to Example 1, a surface treatment is performed on the graphite substrate 11 using any of milling, polishing, a blast processing and an etching processing, whereby the graphite substrate 11 can be processed to have surface unevenness in a range of 1 µm to 8 µm.

Example 3

Figure 8:
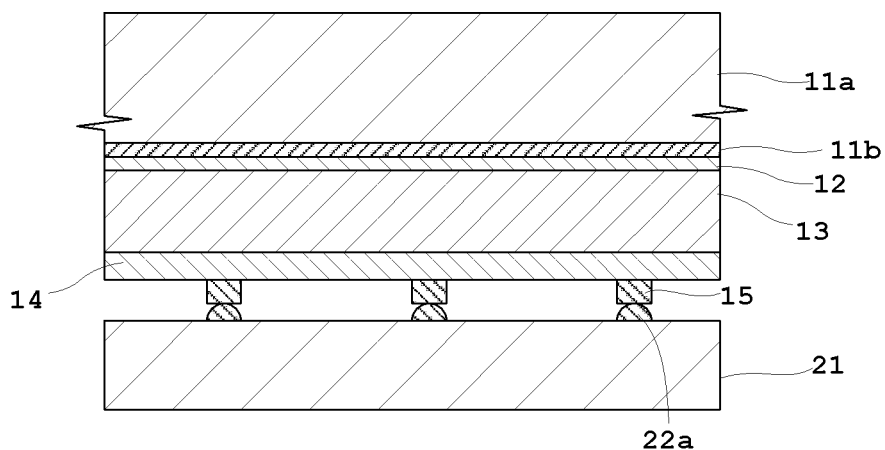
FIG. 8 is a longitudinal sectional view in which a configuration on the support substrate side is joined to a configuration on a read-out side according to a further example of this invention.

Next, Example 3 of this invention will be described in detail hereinafter with reference to the drawings. FIG. 8 is a longitudinal sectional view in which a configuration on a support substrate side is joined to a configuration on a read-out side according to Example 3. In FIG. 8, similar to FIG. 7 in the aforementioned Example 2, a read-out pattern of such as the capacitor 23 and the thin film transistor 24 on the read-out substrate 21 side is omitted. Only a read-out substrate 21 and bumps 22a are illustrated.

Example 3 differs from Examples 1 and 2 in that not the graphite substrate but a support substrate 11a is adopted as the substrate, the support substrate 11a performs support independently of the voltage application electrode 11b as shown in FIG. 8. On the other hand, similar to Example 2, the pixel electrodes in Example 3 are not provided on the read-out substrate 21 side, which differs from Example 1. In Example 3, the pixel electrodes 15 are provided on a support substrate 11a side. That is, the voltage application electrode 11b, the electron blocking layer 12, the semiconductor layer 13, the positive-hole blocking layer 14, and the pixel electrodes 15 are laminated in this order on the support substrate 11a. Here, the support substrate 11a corresponds to the support substrate in this invention. The voltage application electrode 11b corresponds to the voltage application electrode in this invention.

Example 3 differs from Examples 1 and 2 in that a material with lower absorption coefficient of radiation is used for the support substrate 11a. For instance, any of aluminum oxide, aluminum nitride, boron nitride, oxidization silicon, silicon nitride or silicon carbide, or a material obtained through firing mixture of these materials is used for the support substrate 11a. A conductive material such as ITO, Au, and Pt, is used for the voltage application electrode 11b, which is similar to the pixel electrode 15. The material used for the other electron blocking layer 12, the semiconductor layer 13, the positive-hole blocking layer 14, and the pixel electrode 15 is the same as that in Example 2 mentioned above. Similar to Examples 1 and 2, either the electron blocking layer 12 or the positive-hole blocking layer 14, or both of them may be omitted as long as the radiation detector has no problem in its property.

Similar to Examples 1 and 2, the read-out substrate 21 has the capacitors 23 and thin film transistors 24, etc. (see FIG. 4) to form a pattern. In Example 3, the bumps 22a are formed on a portion (a pixel region) corresponding to the capacity electrodes 23a of the capacitor 23 (see FIG. 4), and are connected to the pixel electrodes 15. Thereby the support substrate 11a is joined to the read-out substrate 21.

Next, description will be given of a concrete method of manufacturing the aforementioned radiation detector.

Similar to Examples 1 and 2, a surface treatment is performed on the support substrate 11a using any of milling, polishing, a blast processing and an etching processing, whereby the support substrate 11a can be processed to have surface unevenness in a range of 1 µm to 8 µm. A cleaning treatment for cleaning the support substrate 11a is preferably performed prior to the aforementioned surface treatment. Thereby impurities and particles on the surface of the support substrate 11a can be removed.

Next, the voltage application electrode 11b, the electron blocking layer 12, the semiconductor layer 13, and the positive-hole blocking layer 14 are laminated in this order on the support substrate 11a having the specified unevenness in a range of 1 µm to 8 µm. In Example 3, the voltage application electrode 11b is laminated on the support substrate 11a through spattering or evaporation. The electron blocking layer 12, the semiconductor layer 13, and the positive-hole blocking layer 14 are formed in the same manner as in Examples 1 and 2.

Then the support substrate 11a on which the voltage application electrode 11b is laminated is joined to the read-out substrate 21 together with the pixel electrodes 15 and the semiconductor layer 13 such that the pixel electrodes 15 are joined to the read-out substrate 21 side.

According to the radiation detector in Example 3 having the aforementioned configuration, the polycrystalline-film semiconductor layer 13 is formed by CdTe, ZnTe, or CdZnTe. The support substrate 11a performing support independently of the voltage application electrode 11b is adopted as the substrate. The pixel electrodes 15 are provided on the support substrate 11a side. In this case, the support substrate 11a has surface unevenness in a range of 1 µm to 8 µm. When the support substrate 11a has surface unevenness of 1 µm to 8 µm, the semiconductor layer 13 to be laminated on the support substrate 11a has a stable film quality, and thus adhesion of the support substrate 11a and the semiconductor layer 13 can be enhanced.

Figure 9:
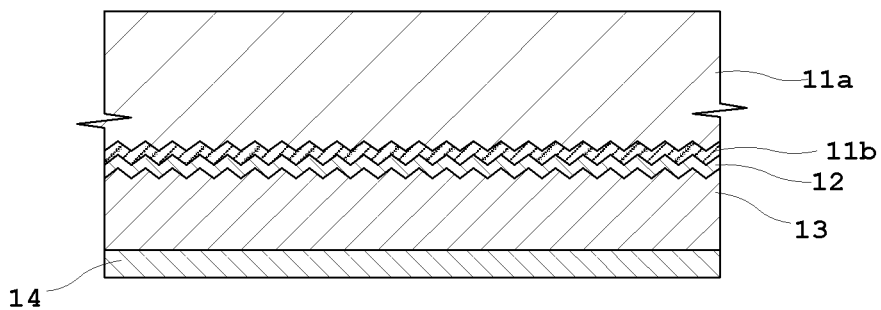
FIG. 9 is a schematic view used for explanation of transferring unevenness when a voltage application electrode and an electron blocking layer are interposed between the support substrate and the semiconductor layer.

Here, when the support substrate 11a is adopted as in Example 3, the support substrate 11a may be composed of any of aluminum oxide, aluminum nitride, boron nitride, oxidization silicon, silicon nitride or silicon carbide, or may be obtained through firing mixture of these materials. The voltage application electrode 11b between the support substrate 11a and the semiconductor layer 13 is thin and unevenness on the surface of the support substrate 11a is transferred onto the voltage application electrode 11b as shown in the schematic view of FIG. 9. Consequently, when the support substrate 11a has surface unevenness of 1 µm to 8 µm, the voltage application electrode 11b also has surface unevenness approximately in such range. Thus, almost the same effect as the configuration in which the semiconductor layer 13 is laminated on the support substrate 11a can be produced. Similar to FIG. 6, in the schematic view of FIG. 9, the unevenness is enlarged comparing to the surroundings for illustrating the unevenness clearly. Please note that a practical size of the unevenness is smaller.

In Example 3, similar to Examples 1 and 2, the electron blocking layer 12 is directly connected to the semiconductor layer 13 on the support substrate 11a side, whereas the positive-hole blocking layer 14 is directly connected to the semiconductor layer 13 on a side opposite to the support substrate 11a side. Thereby the electron blocking layer 12 in addition to the aforementioned voltage application electrode 11b is interposed between the support substrate 11a and the semiconductor layer 13. When the electron blocking layer 12 is interposed between the support substrate 11a and the semiconductor layer 13, the surface unevenness of the support substrate 11a is transferred onto the blocking layer (the electron blocking layer 12 in Example 3). Consequently, almost the same effect as the configuration in which the semiconductor layer 13 is directly connected to the support substrate 11a can be produced.

In Example 3, a surface treatment is performed on the support substrate 11a using any of milling, polishing, a blast processing and an etching processing, whereby the support substrate 11a can be processed to have surface unevenness in a range of 1 µm to 8 µm.

This invention is not limited to the foregoing embodiment, but may be modified as follows.

(1) The foregoing examples have been described taking X-rays as an example of radiation. Radiation other than X-rays may be exemplified by gamma-rays and light, and thus is not particularly limited.

(2) The manufacturing method in each aforementioned example is not limitative.

The invention claimed is:

1. A radiation detector for detecting radiation, comprising:
   a polycrystalline-film semiconductor layer formed by CdTe (Cadmium Telluride), ZnTe (Zinc Telluride), or CdZnTe (Cadmium Telluride Zinc) for converting radiation information into charge information by incidence of radiation;
   a voltage application electrode for applying bias voltage to the semiconductor layer;
   pixel electrodes for reading out the charge information;
   a support substrate composed of any of aluminum oxide, aluminum nitride, boron nitride, oxidization silicon, silicon nitride, and silicon carbide, or mixture of these materials for supporting the voltage application electrode, the semiconductor layer, and the pixel electrodes; and
   a read-out substrate having a read-out pattern formed thereon,
   the support substrate having surface unevenness in a range of 1 µm to 8 µm when the voltage application electrode is laminated on the support substrate, the semiconductor layer is laminated on the voltage application electrode, the pixel electrodes are laminated on the semiconductor layer, and the support substrate with the voltage application electrode laminated thereon is joined to the read-out substrate together with the pixel electrodes and the semiconductor layer such that the pixel electrodes are joined to a read-out substrate side.

2. The radiation detector according to claim 1, wherein at least either an electron blocking layer or a positive-hole blocking layer is directly connected to the semiconductor layer.

3. The radiation detector according to claim 2, wherein either the electron blocking layer or the positive-hole blocking layer is interposed between the support substrate and the semiconductor layer.

4. A method of manufacturing a radiation detector, the radiation detector comprising: a polycrystalline-film semiconductor layer formed by CdTe (Cadmium Telluride), ZnTe (Zinc Telluride), or CdZnTe (Cadmium Telluride Zinc) for converting radiation information into charge information by incidence of radiation;
   a graphite substrate for voltage application electrode doubling as a support substrate for applying bias voltage to the semiconductor layer; and a read-out substrate with pixel electrodes for reading out the charge information,
   the graphite substrate having surface unevenness in a range of 1 µm to 8 µm when the semiconductor layer is laminated on the graphite substrate and the graphite substrate with the semiconductor layer laminated thereon is joined to the read-out substrate such that the semiconductor layer and the pixel electrodes are joined inside, and
   a surface treatment being performed on the surface unevenness of the graphite substrate through any of milling, polishing, a blast processing or an etching processing, wherein a cleaning treatment for cleaning the graphite substrate is performed prior to the surface treatment.

5. The method of manufacturing the radiation detector according to claim 4, wherein at least either an electron blocking layer or a positive-hole blocking layer is directly connected to the semiconductor layer.

6. A method of manufacturing a radiation detector, the radiation detector comprising: a polycrystalline-film semiconductor layer formed by CdTe (Cadmium Telluride), ZnTe (Zinc Telluride), or CdZnTe (Cadmium Telluride Zinc) for converting radiation information into charge information by incidence of radiation;
   a graphite substrate for voltage application electrode doubling as a support substrate for applying bias voltage to the semiconductor layer; pixel electrodes formed for every pixel for reading out the charge information; and a read-out substrate having a read-out pattern formed thereon, the graphite substrate having surface unevenness in a range of 1 µm to 8 µm when the semiconductor layer is laminated on the graphite substrate, the pixel electrodes are laminated on the semiconductor layer, and the graphite substrate with the semiconductor layer laminated thereon is joined to the read-out substrate together with the pixel electrodes such that the pixel electrodes are joined to a read-out substrate side, and a surface treatment being performed on the surface unevenness of the graphite substrate through any of milling, polishing, a blast processing or an etching processing, wherein a cleaning treatment for cleaning the graphite substrate is performed prior to the surface treatment.

7. The method of manufacturing the radiation detector according to claim 6, wherein at least either an electron blocking layer or a positive-hole blocking layer is directly connected to the semiconductor layer.

8. A method of manufacturing a radiation detector, the radiation detector comprising:
   a polycrystalline-film semiconductor layer formed by CdTe (Cadmium Telluride), ZnTe (Zinc Telluride), or CdZnTe (Cadmium Telluride Zinc) for converting radiation information into charge information by incidence of radiation;
   a voltage application electrode for applying bias voltage to the semiconductor layer;
   pixel electrodes for reading out the charge information;
   a support substrate composed of any of aluminum oxide, aluminum nitride, boron nitride, oxidization silicon, silicon nitride and silicon carbide, or obtained through firing mixture of these materials for supporting the voltage application electrode, the semiconductor layer, and the pixel electrodes; and
   a read-out substrate having a read-out pattern formed thereon,
   the support substrate having surface unevenness in a range of 1 µm to 8 µm when the voltage application electrode is laminated on the support substrate, the semiconductor layer is laminated on the voltage application electrode, the pixel electrodes are laminated on the semiconductor layer, and the support substrate with the voltage application electrode laminated thereon is joined to the read-out substrate together with the pixel electrodes and the semiconductor layer such that the pixel electrodes are joined to a read-out substrate side, and a surface treatment being performed on the surface unevenness of the support substrate through any of milling, polishing, a blast processing or an etching processing.

9. The method of manufacturing the radiation detector according to claim 8, wherein at least either an electron blocking layer or a positive-hole blocking layer is directly connected to the semiconductor layer.

10. The method of manufacturing the radiation detector according to claim 8, wherein a cleaning treatment for cleaning the support substrate is performed prior to the surface treatment.

\* \* \* \* \*